United States Patent

Linder

[15] 3,694,776

[45] Sept. 26, 1972

[54] ADAPTIVE FILTER WHEREIN OPPOSITE CONDUCTIVITY TRANSISTORS ARE OPERATIVE IN RESPONSE TO SIGNALS IN EXCESS OF PREDETERMINED AMPLITUDE

[72] Inventor: Donald L. Linder, Elmhurst, Ill.

[73] Assignee: Motorola, Inc., Franklin Park, Ill.

[22] Filed: Dec. 14, 1970

[21] Appl. No.: 97,741

[52] U.S. Cl...................333/17, 307/235 R, 307/237, 307/295, 330/13, 330/31, 330/151, 331/17, 333/70 CR

[51] Int. Cl.............................H03g 5/16, H03h 7/10

[58] Field of Search..333/17, 7 OR, 70 CR; 328/167; 307/255, 288, 235, 237, 295, 229; 330/13, 151; 331/17

[56] References Cited

UNITED STATES PATENTS 3,600,696 8/1971 Grandmont.................330/13
3,119,029 1/1964 Russell.......................307/229
3,475,623 10/1969 Moog....................333/70 R X
3,526,845 9/1970 Sikorra.....................330/13 X
3,543,191 11/1970 Plunkett............333/70 CR X

*Primary Examiner*—Paul L. Gensler
*Attorney*—Vincent Rauner and L. Arnold

[57] ABSTRACT

An adaptive filter circuit for filtering and attenuating signals coupled thereto which includes first and second opposite conductivity transistors having base electrodes coupled together and emitter electrodes coupled together. The first and second transistors are operative to conduct in response to portions of the signal coupled thereto in excess of a predetermined amplitude. A filter network is coupled to the first and second transistors and has a first predetermined attenuation characteristic when the transistors are non-conductive and a second predetermined attenuation characteristic when the transistors are conductive.

8 Claims, 3 Drawing Figures

INVENTED BY
DONALD L. LINDER
BY Vincent J. Rauner
ATTY.

ADAPTIVE FILTER WHEREIN OPPOSITE CONDUCTIVITY TRANSISTORS ARE OPERATIVE IN RESPONSE TO SIGNALS IN EXCESS OF PREDETERMINED AMPLITUDE

BACKGROUND OF THE INVENTION

Filters having variable frequency and attenuation characteristics in response to particular input signals are desirable and quite useful in a number of applications. For example, in a phase-locked loop oscillator circuit a reference signal is compared against a controlled oscillator signal in a phase detector or comparator. The detector develops an alternating current (AC) signal, commonly known as an error signal, if the reference signal and controlled signal are not identical in phase and frequency. The frequency of the AC signal will vary in accordance with the difference between the oscillator and reference signals. If there is a substantial difference in phase and frequency between the reference and oscillator signals, the error signal will be a large amplitude AC signal, usually a high frequency signal. If there is only a small difference between the compared signals, the error signal will be a small amplitude AC signal of very low frequency. The error signals are coupled back to the controlled oscillator to correct or control its frequency.

If this type of oscillator is modulated, it is desirable that the oscillator not respond to slight or short term variations due to modulation, but respond to large and long term variations due to substantial frequency errors. Furthermore, when the reference and oscillator signals are close in frequency, it is desirable to prevent extraneous high frequency low amplitude noise from effecting the frequency of the controlled oscillator. A filter is therefore added which can filter and attenuate the undesirable low amplitude high frequency noise and the low amplitude low frequency error signals due to modulation. It is desirable that the filter be adaptive in that it will allow high amplitude, high frequency signals to pass substantially unattenuated in order to vary the frequency of the oscillator. This means the filter must change its frequency response and attenuation characteristics in response to some characteristic of the signal such as changes in the amplitude.

Adaptive filters previously used were complex multistage circuits employing feedback arrangements in order to change the frequency response. More often, phase locked loop oscillator circuits employed two error loops, one to detect and filter the small amplitude error signals, and a second responsive only to the large amplitude error signals, thus avoiding the need for an adaptive filter.

SUMMARY OF THE INVENTION

It is therefore an object of this invention to provide an improved adaptive filter circuit.

Another object of this invention is to provide an adaptive filter circuit requiring a minimum number of circuit components.

Yet another object of this invention is to provide an adaptive filter circuit whose frequency response and attenuation characteristics change in response to changes in amplitude of the signals coupled thereto.

In practicing this invention, an adaptive filter circuit is provided including first and second opposite conductivity transistors, each having base, emitter and collector electrodes. The base electrodes are coupled together and the emitter electrodes are coupled together. The collector electrodes are coupled across a potential supply. Input signals are coupled to the base electrodes of both transistors. The first transistor is operative to conduct in response to portions of the signals having a first polarity and exceeding a predetermined amplitude. The second transistor is operative to conduct in response to portions of the signals having a second polarity and an amplitude in excess of the predetermined amplitude. A filter circuit, including resistance and reactance component, is coupled to the base electrodes and emitter electrodes of the first and second transistors. The filter circuit has a first filter resistance and a first attenuation characteristic when the transistors are non-conductive, and a second filter resistance and second attenuation characteristic when the transistors are conductive.

DETAILED DESCRIPTION OF THE INVENTION

Figure 1:
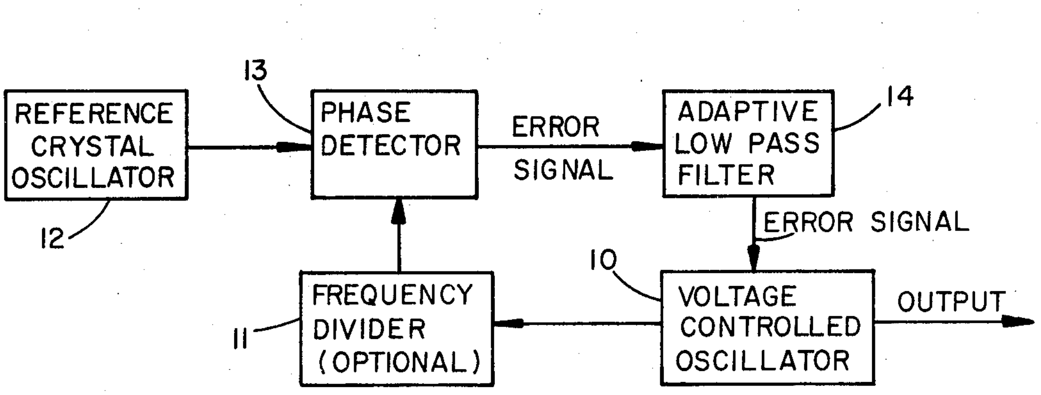
FIG. 1 is a block diagram of a phase locked loop oscillator circuit employing the adaptive filter of this invention.

Referring to FIG. 1, there is shown a phase locked loop oscillator circuit employing the adaptive filter of this invention. The voltage controlled oscillator (VCO) 10 develops a desired high frequency oscillation signal which can be used, for example, as the carrier wave of a transmitter. This signal is coupled to frequency divider 11 which may or may not be used, depending upon the frequency of the VCO 10, to divide the VCO 10 signal to develop an oscillator signal close in frequency to that developed by reference crystal oscillator 12. The reference signal from reference crystal oscillator 12 and the controlled oscillator signal are both coupled to phase detector 13 where the phase and frequency are compared to develop an error signal. This error signal is an AC signal which varies in frequency in accordance with the difference in frequency between the controlled oscillator signal and the reference oscillator signal, and whose amplitude varies in accordance with the error magnitude. The error signal is coupled from phase detector 13 to adaptive filter 14. If the error signal consists of large amplitude high frequency signals, adaptive filter 14 will allow the large amplitude AC error signals to be coupled to VCO 10 substantially unattenuated, to control VCO 10 and rapidly return it to its desired frequency. If the error signal consists of low amplitude low frequency signals, or low amplitude high frequency signals such as noise pulses, they will be substantially attenuated by adaptive filter 14 thereby preventing any sharp changes in the desired frequency due to modulation or low level noise.

Figure 2:
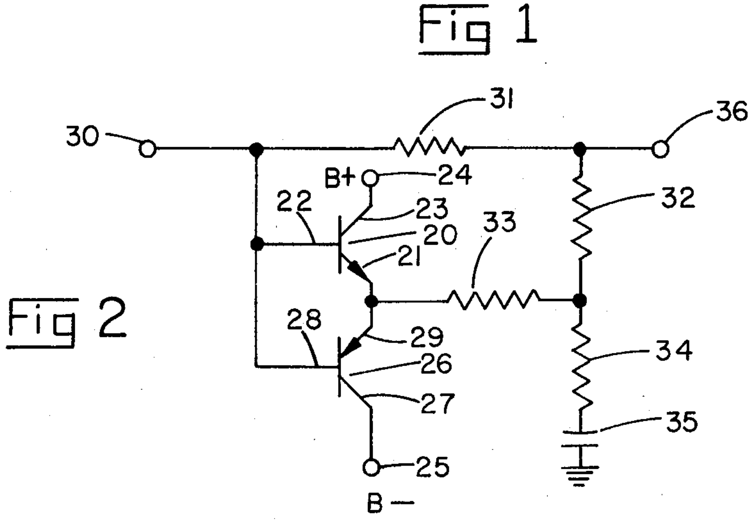
FIG. 2 is a schematic diagram of an adaptive low pass filter employing the features of this invention.

Referring to FIG. 2, there is shown a schematic diagram of an adaptive low pass filter employing the features of this invention. The adaptive filter 14 shown in FIG. 2 includes a first transistor 20, and a second transistor 26. The transistors are of opposite conductivity types. That is, the transistor 20 is an NPN composition transistor, and transistor 26 is a PNP composition transistor. Base electrodes 22 and 28 of transistors 20 and 26 are coupled together and to input terminal 30 of adaptive filter 14. Emitter electrodes 21 and 29 of transistors 20 and 26 are coupled together. Collector electrode 23 of transistor 20 is coupled to a source of B+ potential at terminal 24, and collector electrode 27 of transistor 26 is coupled to a source of B− potential at terminal 25. Transistors 20 and 26 are direct current coupled together to provide an operating DC path from the positive supply potential at terminal 24 to the negative supply potential at terminal 25. Resistor 31 has one end coupled to the junction of input terminal 30 and the base electrodes of transistors 20 and 26. Resistor 33 has a first end coupled to the junction of emitter electrodes 21 and 29 of transistors 20 and 26. Resistor 32 is coupled between the second ends of resistors 31 and 33. The junction of resistors 31 and 32 is coupled to terminal 36, the filter output terminal. Resistor 34 and capacitor 35 are series connected between the junction of resistors 32 and 33 and ground potential.

Figure 3:
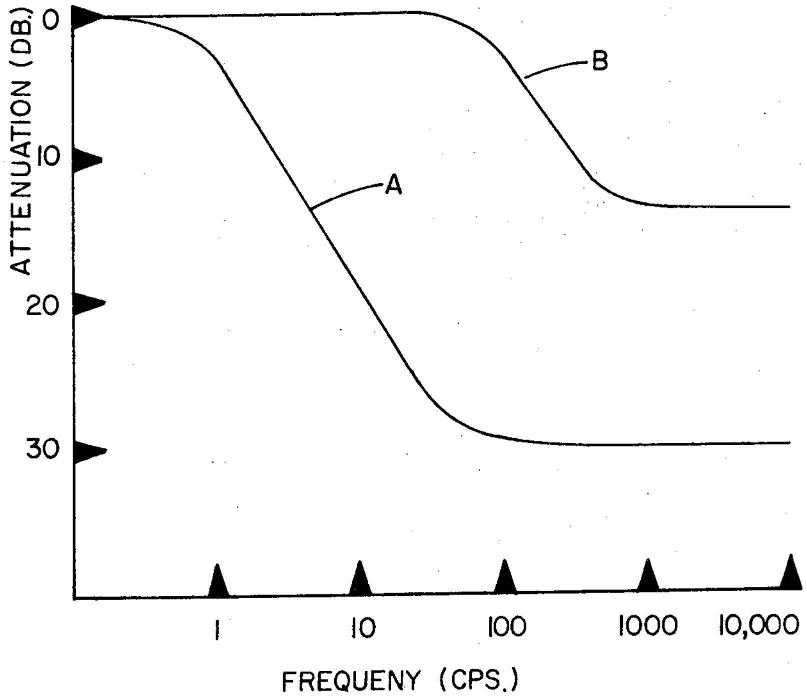
FIG. 3 is a graph of the frequency and attenuation characteristics of the adaptive low pass filter of FIG. 2.

In operation, a signal such as the error signal from phase detector 13 shown in FIG. 1 is coupled to terminal 30 of the adaptive low-pass filter shown in FIG. 2. If the error signal amplitude coupled to terminal 30 is not large enough to cause transistors 20 and 26 to conduct, the filter network will consist of resistors 31, 32 and 34 and capacitor 35. The frequency vs. attenuation characteristics of this filter are shown in FIG. 3, Curve A. Curve A shows that all except the very lowest frequencies are substantially attenuated, preventing the AC error signal from being coupled to output terminal 36.

If the AC error signal exceeds a particular amplitude, it will forward bias transistor 20 or 26, causing it to conduct. Transistor 20 will conduct on a positive half-cycle of the AC signal coupled to terminal 30 if the error signal amplitude is greater than the base to emitter voltage drop of transistor 20. This is approximately 0.7 volts for silicon transistors such as used here. Transistor 26 will conduct on the negative half-cycle of the AC signal coupled to terminal 30 if the signal amplitude is greater than the base to emitter voltage drop of transistor 36, or greater than 0.7 volts. If the error signal amplitude is great enough to cause transistor 20 or 26 to conduct, the emitter electrode of one of transistors 20 or 26 will be coupled to its base electrode, causing the filter network to consist of the series combination of resistors 31 and 32, in parallel with resistor 33; and with the parallel combination in series with resistor 34 and capacitor 35 to ground. If resistor 31 is selected such that it is substantially greater in resistance than resistor 33, the filter circuit will consist primarily of resistors 32, 33 and 34, and capacitor 35. FIG. 3, Curve B shows the attenuation vs. frequency characteristic of the adaptive filter of FIG. 2 when transistor 20 or 26 is conductive and resistor 31 is substantially greater in resistance than resistor 33. Curve B shows that the large amplitude error signals are passed to output terminal 36 substantially unattenuated.

It will be apparent from FIG. 3, that when the adaptive low pass filter of FIG. 2 is used in the system of FIG. 1, low amplitude error signals at all frequencies except the very lowest are substantially attenuated, and when the amplitude of the error signals increases, there is substantially no attenuation thereof so that the error signals from filter 14 are effective to control the frequency of oscillator 10.

As can be seen, an adaptive loop filter has been provided which requires a minimum of components, and which is easily and simply changed from a first frequency and attenuation characteristic, to a second frequency and attenuation characteristic.

What is claimed is:

1. An adaptive filter circuit including in combination; filter means having an input terminal and an output terminal, said filter means having a first predetermined attenuation characteristic for attenuating and filtering signals coupled therethrough from said input terminal to said output terminal, first and second opposite conductivity transistors coupled together and to said input terminal and a first terminal of said filter means, said first transistor operative in response to portions of said signals coupled to said filter means input terminal having a first polarity and in excess of a predetermined amplitude to conduct, said second transistor operative in response to portions of said signals having a second polarity and in excess of said predetermined amplitude to conduct, said first and second transistor conduction being operative to change the first predetermined attenuation characteristic of signals coupled through said filter means from said input terminal to said output terminal to a second predetermined attenuation characteristic.

2. The adaptive filter of claim 1 wherein said first and second transistors further include base, emitter and collector electrodes, said base electrodes being coupled together and to the input terminal of said filter means, said emitter electrodes being coupled together and to the first terminal of said filter means.

3. The adaptive filter of claim 2 wherein said signals coupled thereto are alternating current signals, each of said transistors when conductive coupling the base electrode to the emitter electrode for coupling said input terminal to said first terminal to change the attenuation characteristic of said filter.

4. The adaptive filter of claim 3 wherein said filter means includes resistance means and reactance means coupled together and to said input and first terminals, said filter means having a first filter resistance and a first attenuation characteristic when said transistors are non-conductive, and a second filter resistance and second attenuation characteristic when said transistors are conductive.

5. The adaptive filter of claim 4 wherein said filter means includes, first resistance means having a first end coupled to said input terminal and a second end, second resistance means having a first end coupled to said first terminal and a second end, third resistance means coupled between said first and second resistance means second ends, and fourth resistance means and first reactance means series connected and coupled between said second resistance means second end and a ground potential, said transistor means when conductive being operative to couple said input and first terminals together to provide said second filter resistance and second attenuation characteristic.

6. The filter of claim 5 wherein said first resistance means is a resistor and said second resistance means is a resistor, said first resistance means having substantially greater resistance than said second resistance means.

7. The filter of claim 6 wherein said output terminal is coupled to said first resistance means second end.

8. An adaptive filter circuit for filtering and attenuating signals coupled thereto including in combination; first and second transistors of opposite conductivity types and each having base, emitter and collector electrodes, said base electrodes being coupled together and said emitter electrodes being coupled together, said first transistor operative in response to portions of said signals coupled to said filter having a first polarity and in excess of a predetermined amplitude to conduct, said second transistor operative in response to portions of said signals having a second polarity and in excess of said predetermined amplitude to conduct, filter means having an input terminal and an output terminal and including resistance means and reactance means coupled together and to said base electrodes and emitter electrodes, said filter means having a first filter resistance and first attenuation characteristic of signals coupled therethrough from said input terminal to said output terminal when said transistors are non-conductive, and a second filter resistance and second attenuation characteristic of signals coupled therethrough from said input terminal to said output terminal when said transistors are conductive.

* * * * *